United States Patent [19]

Goldberg et al.

[11] Patent Number: 5,104,944

[45] Date of Patent: Apr. 14, 1992

[54] PROCESS FOR NUCLEOPHILIC DERIVATIZATION OF MATERIALS HAVING AN IMIDE GROUP CONJUGATED TO AN AROMATIC MOIETY

[75] Inventors: Martin J. Goldberg, Mahopac; Daniel P. Morris, Purchase; Alfred Viehbeck, Stormville, all of N.Y.

[73] Assignee: International Business Machines Corporation, Armonk, N.Y.

[21] Appl. No.: 381,627

[22] Filed: Jul. 18, 1989

[51] Int. Cl.$^5$ .................... C08L 77/06; C08G 69/28; C08G 69/42; C08G 69/26

[52] U.S. Cl. .................... 525/436; 528/332; 528/351; 528/352; 528/353; 528/322

[58] Field of Search ............... 525/436, 322; 528/332, 528/351, 352, 353

[56] References Cited

U.S. PATENT DOCUMENTS

| | | | |
|---|---|---|---|
| 3,261,811 | 7/1966 | Taturn | 525/436 |
| 3,282,897 | 11/1966 | Angelo | 525/436 |
| 3,459,706 | 8/1969 | Schweitzer | 528/128 |
| 3,922,465 | 11/1975 | Kawaguchi et al. | 428/383 |
| 4,405,770 | 9/1983 | Schoenberg et al. | 526/406 |
| 4,431,758 | 2/1984 | Osada et al. | 524/600 |
| 4,496,715 | 1/1985 | Sattler | 528/289 |
| 4,551,522 | 11/1985 | Fryd et al. | 528/353 |

Primary Examiner—Harold D. Anderson
Assistant Examiner—T. Mosley
Attorney, Agent, or Firm—Daniel P. Morris

[57] ABSTRACT

A process for the synthesis of derivatives of materials containing an imide group conjugated to an aromatic moiety to form an ester, a thioester, an amide, a ketone, and silylesters. Electrons are supplied to redox sites to form a reduced imide material. The reduced imide material is contacted with a nucleophile which opens the imide ring of the reduced imide and chemically combines with a carbonyl carbon atom of the open imide ring to form an imide derivative.

40 Claims, No Drawings

PROCESS FOR NUCLEOPHILIC DERIVATIZATION OF MATERIALS HAVING AN IMIDE GROUP CONJUGATED TO AN AROMATIC MOIETY

CROSS REFERENCE TO RELATED APPLICATIONS

Copending U.S. application Ser. No. 07/290,486 entitled "Method For Conditioning Organic Polymeric Materials" to Viehbeck et al. filed on Dec. 23, 1988 describes certain organic polymeric materials which are capable of reversibly accepting or donating electrons from a reducing entity. The redox sites in the polymer accept electrons and, as a result, a change in the properties of the polymer occurs. This change is useful in modifying or etching the polymeric material The material can be modified by incorporation of metallic seeds into the material at a controlled depth. The seeds are incorporated by interaction of cations of the metals with the redox sites in the polymer, which cause the reduction of the cations to form the neutral metallic seeds. Subsequent exposure of the polymer material containing the seeds to an electroless bath causes further deposition of metal having the desirable characteristic of good adhesion to the polymeric material. Etching of the polymeric material can be carried out as a result of an increase in solubility of the polymer in aprotic solvents when its redox sites have accepted electrons. The increase solubility allows openings to be etched in certain areas of the polymeric material that have been reduced, leaving other areas unchanged.

Copending U.S. application Ser. No. 07/381,552 entitled "Electrophilic Derivatives of Compounds Containing a Carbonyl Group Conjugated to an Aromatic Moiety and Methods of Fabrication Thereof" to Goldberg et al. filed on the same day describes derivatives of compounds containing a carbonyl group conjugated to an aromatic moiety and methods of fabrication thereof, consisting of a thioether, an ester, an ether, a phosphate and a silylether. Electrons are supplied to the carbonyl group conjugated to an aromatic moiety to form a reduced material. The reduced material is contacted with an electrophile which attacks and chemically combines with the carbonyl group conjugated to an aromatic moiety. The parent material can be regenerated by hydrolysis of the derivative. A silyl derivative can be selectively formed on a polyimide material surface which can act as a barrier to an RIE of the polyimide material. After etching the polyimide material is regenerated from the silyl derivative.

FIELD OF THE INVENTION

This invention relates to a process for forming derivatives of imide materials more particularly of imide materials having an imide group conjugated to an aromatic moiety, more particularly, of polyimide materials, more particularly for forming an ester, a thioester, an ether, a ketone, and a silylester derivative of a polyimide material, most particularly, to forming a polyamic ethylester from a polyimide material.

BACKGROUND OF THE INVENTION

Polyimides find extensive use in electronic applications where they are useful in forming dielectric films on electrical and electronic devices such as capacitors, semiconductors and semiconductor packaging structures. Typical uses for polyimides include protective coatings for semiconductors, dielectric layers for multilayer integrated circuits, dielectric layers for multilayer integrated circuit packages, high temperature solder masks, bonding multilayer circuits, final passivating coatings on electronic devices and the like.

It is well known in the polymer art to make thermally stable all-aromatic polyimides by the condensation polymerization of dianhydrides and diamines to form polyamic acid. These polyamic acids are readily dehydrated to the corresponding polyimides by heating at high temperatures, e.g. 300° to 400° C.

In electronic applications, a polyimide layer on an electronic device or package is generally fabricated by spinning onto the device or package a liquid polyamic acid. The polyamic acid is there after cured to form polyimide by applying heat. Curing a polyamic acid to a polyimide liberates water on heating. Water is an undesirable material in electronic devices and packages since water can cause corrosion on electrical conductors contained within the device and packages. Alternatively, polyimide can be fabricated from a polyamic ester. A solution of the polyamic ester is spun onto the electronic component, then heated to cure to the polyimide. Curing an ester to form a polyimide liberates an alcohol which is more volatile and less corrosive than water.

Prior art methods of forming polyamic esters use halide containing reagents, in particular chloride containing reagents. Chloride ions are undesirable in electronic components since they introduce mobile charge carriers which can create leakage currents between electrical conductors contained within the electronic component. Chloride ions are also corrosive. Therefore, it is desirable to fabricate a polyamic ester which is free of chloride and can be cured to form a polyimide layer on an electronic component.

It is an object of this invention to fabricate polyimide derivatives which are free of chlorine containing compounds.

U.S. Pat. No. 4,551,522 Fryd et al. describes a process for synthesizing photosensitive polyamic acid derivatives which are polyimide precursors without the use of chloride containing compounds. Polyamic acid derivative synthesized is a polyamic ester. According to the Fryd et al process an aromatic dianhydride is partially derivatized with a reactive monomer containing a photosensitive moiety. The partially derivatized aromatic dianhydride is then condensation polymerized with an aromatic diamine to form polyamic acid. The polyamic acid is thereafter isoimidized to form a polyisoimide. The polyisoimide is condensed to a polyamic acid derivative by reaction with additional reactive monomer. The polyamic acid derivative is a polyamic ester. The polyamic acid derivative is separated out from the solution. Polyamic ester can then be cured to a polyimide.

According to one aspect of the present invention, the starting material is a polyimide from which a polyimide derivative, for example, a polyamic ester, is fabricated. The present invention is applicable to soluble and insoluble polyimides. A solution of the derivative can be formed from a soluble polyimide. A derivative can be formed at the surface of an insoluble polyimide or a bulk insoluble polyimide can be changed to a polyimide derivative.

It is another object of this invention to provide a polyimide derivative from a soluble or insoluble polyimide material.

It is another object of this invention to form a derivative at the surface of the polyimide.

It is another object of this invention to transform a bulk polyimide body to a polyimide derivative body.

According to the present invention a polyimide material is reduced without changing the chemical properties of the polyimide. The polyimide is contacted with a nucleophile which opens the imide rings of the polyimide material forming an intermediate product which upon oxidation is converted into a polyimide derivative, for example a polyamic ester. The polyamic ester can be spun onto an electronic component and then cured to form a polyimide layer which adheres to the component surface.

The present invention is particularly useful for polyimide materials which are not soluble in commonly available solvents. The reduced polyimide is soluble in an aprotic solvent.

It is another object of this invention to reduce an insoluble polyimide in an aprotic solvent rendering it soluble and exposing the reduced form to a nucleophile to form the derivative.

It is another object of this invention to fabricate a polyimide derivative by first reducing the polyimide material and treating the reduced polyimide with a nucleophilic reagent.

The process of the present invention can form the following type polyimide derivatives: an ester, a thioester, an amide, a ketone and a silylester.

It is another object of this invention to fabricate a derivative of a polyimide material to form a material selected from the group of an ester, a thioester, an amide, a ketone, and a silylester.

It is another object of this invention to selectively form a derivative of the surface of a polyimide material.

SUMMARY OF THE INVENTION

The present invention provides a method for forming derivatives of monomeric and polymeric imide compounds and materials having an imide group conjugated to an aromatic moiety.

In particular, according to one aspect of the present invention electrons are supplied to the redox sites of the imide material. The imide material with the electrons thereon is contacted with a nucleophile and optionally with an oxidizing agent to form the imide material derivative.

In a more particular aspect of the present invention, the nucleophile is an organic or inorganic compound having one or more atoms selected from the group consisting of O, S, N, C and Si with one or more cationic leaving groups bonded to these atoms.

In a more particular aspect of the present invention, the nucleophile opens at least one imide ring of the imide material and chemically combines with one of the imide ring carbon atoms. Protons are extracted from the resulting composition to form the imide derivative.

In a more particular aspect of the present invention the imide material is a polyimide material.

In a more particular aspect of the present invention, the nucleophile has general structural formula:

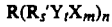

R is an organic or an inorganic radical; R' is selected from the group of hydrogen, an aliphatic radical, a substituted aliphatic radical, an aromatic radical, a substituted aromatic radical, a heterocyclic radical, a substituted heterocyclic radical and combinations thereof. Y is selected from the group consisting of O, S, N, C and Si. X is a cationic leaving group. The imide derivative being an ester, a thioester, an amide, a ketone, and a silylester. Each member of the group of R,R', Y and X forms at least one chemical bond with at least one other member of the group and $s \geq 0$, $t \geq 0$, $m \geq 1$ and $n \geq 1$ wherein n is the number of reactive centers on the nucleophile.

In another more particular aspect of the present invention, the cationic leaving group is selected from the group of $H^+$, $Na^+$, $Li^+$, $K^+$ and $Cs^+$, or bivalent ions, such as $Mg^{+2}$, $Ca^{+2}$ or polyvalent ions, such as $V+3$.

In another more particular aspect of the present invention, electrons are supplied to the imide material by a chemical or electrochemical reduction process.

In another more particular aspect of the present invention the imide material is soluble.

In another more particular aspect of the present invention, the imide material is insoluble.

In another more particular aspect of the present invention a bulk imide material can be derivatized.

In another more particular aspect of the present invention, an imide material surface can be selectively derivatized by selectively supplying electrons to the polyimide surface.

These and other objects, features and advantages will be apparent from the following more particular description of the preferred embodiments.

DETAILED DESCRIPTION OF THE PREFERRED EMBODIMENTS

The invention will be described with reference to polyimide materials, the preferred imide materials. The inventions herein are applicable to any monomeric or polymeric material or compound containing an imide group conjugated to an aromatic moiety as is found, for example, in polyimide materials.

The first step of the process of the invention is directed to introducing electrons at the imide functionally of an imide material. The electrons are believed to be supplied to a molecular orbital of the imide group conjugated to the aromatic moiety wherein the electron probability maxima is located at one of the carbonyl groups of the imide material. These molecular orbitals are referred to herein as redox sites.

The materials treated pursuant to the present invention are capable of being reduced, i.e. accept, electrons. In particular, such polymers are polyimide polymers which include polyimides, and modified polyimides. The Encyclopedia of Chemical Technology Third Edition article entitled, "Polyimides", Vol. 18, p. 704–719, the teaching of which is incorporated by reference describes various polyimide materials including honopolymers. The polyimides are of interest in view of their continually expanding use in providing electronic devices and packaging and in view of their widespread availability. Discussion of various electrochemical properties concerning polyimides can be found in U.S. Pat. No. 4,512,855 to Mazur; Haushalter, et al., "Thin Solid Films", 102, 161 (1983); Mazur, et al., "Electrochemical Society, Electrochemical Science and Technology, pp. 346–353, February 1987; and Mazur, et al., "Electrochemical Growth of Metal Interlayers and Polyimide Film", Journal of Physical Chemistry, 1986, 90, pp. 1365–1372.

Polyimide has the capacity of accepting electrons from another material or chemical entity at a finite rate without itself undergoing a change which limits this capacity. The chemical may be molecular, ionic, atomic, or adjacent redox sites within or in contact with the polymer. The redox potential of the polymer is positive to the reduction potential of the chemical entity, thereby permitting the polymer to readily accept electrons. The polymer must possess chemical functionality (redox sites) whose redox potential is positive relative to the reduction potential of the chemical entity. Examples of such functional groups include the aromatic imide groups of modified and unmodified polyimides. The groups, as discussed above, are compatible with chemical entities whose reduction potentials are more positive than the oxidation potential of the reduced electroactive polymer.

In addition, the polymer functionality must be reversibly redox active, that is, capable of accepting and donating electrons rapidly and without competing, irreversible chemical changes. This reversibility may require such precautions as exclusion of oxygen or potential proton donors. The polymer must also be able to take up sufficient solvent by swelling or absorption to permit diffusion of electrolyte ions into the polymer.

Preferably, the polymer should have a molecular weight sufficient that films of the material will maintain mechanical integrity in an electrolyte solution. The molecular weight required depends on the structure of the polymer and solvent and should generally be greater than 5,000–10,000 daltons.

The polyimides that can be treated in accordance with the present invention include unmodified polyimides, as well as modified polyimides such as polyester imides, polyamide-imide-esters, polyamide-imides, polysiloxane-imides, as well as other mixed polyimides or polyimide blend materials. Such are well-known in the prior art and need not be described in any great detail.

Generally, the polyimides include polymers having diimide and monoimide recurring units.

Generally, the polyimides having diimide units have the following recurring units:

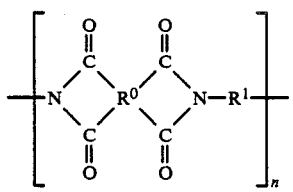

wherein n is an integer representing the number of repeating units to provide a molecular weight usually about 10,000 to about 100,000. $R^0$ is at least one tetravalent organic radical selected from the group consisting of:

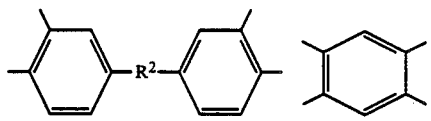

-continued

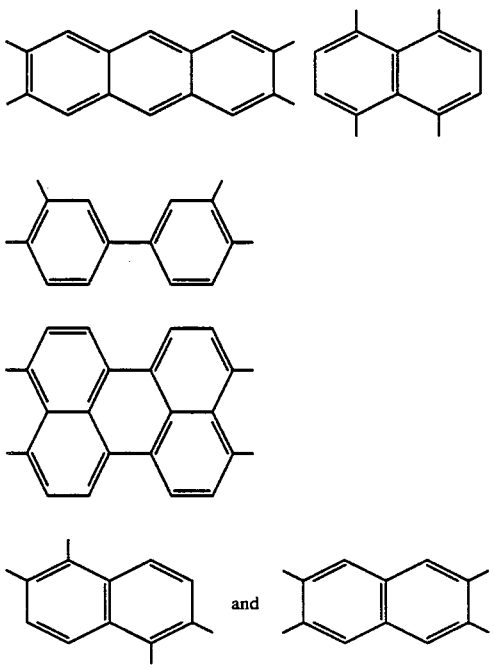

$R^2$ being selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals and in which $R^1$ is at least one divalent radical selected from the group consisting of an aliphatic organic radical or from the group shown:

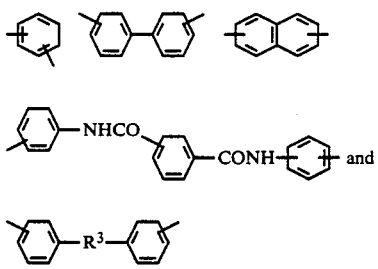

in which $R^3$ is a divalent organic radical selected from the group consisting of $R_2$, silico, and amino radicals. Polymers containing two or more of the $R^0$ and/or $R^1$ radicals, especially multiple series of $R^1$ containing amido radicals, can be used.

Generally, the polyimides having monoimide units have the following recurring units

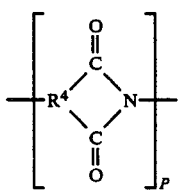

where $R^4$ is trivalent and p is an integer representing the number of repeating units to provide a molecular weight usually about 10,000 to 100,000. Examples of monoimide polyimides are given in "The Encyclopedia of Chemical Technology Third Edition" article incorporated by reference supra.

Polyimides are available commercially from a variety of suppliers in one of three forms: a) as solutions of the polyamic acid precursors (e.g., DuPont Pyralin); b) as pre-imidized polyimide film (e.g., DuPont Kapton ® film); or c) as pre-imidized powders (e.g., Ciba-Geigy Matrimid 5218) or solutions (e.g., Ciba-Geigy Probimide). The chemistry of commercial polyimides includes examples of many of the components listed above, but a preferred polymer for use pursuant to the present invention is based on the monomers pyromellitic dianhydride (PMDA) and oxydianiline (ODA, also named 4,4'-diaminodiphenyl ether). Other preferred polymers for use pursuant to the present invention are the polymers of benzophenonetetracarboxylic dianhydride (BTDA) and ODA and/or 1,3-phenylenediamine and polymer of 3,3',4,4'-biphenylenetetracarboxylic acid (BPDA) and 1,4-phenylenediamine (PDA). Polyimide films based on PMDA-ODA are available from Allied Corporation under the tradename Apical ® and from Du Pont under the tradename Kapton ®. Films based on BPDA-PDA are available from Ube Corporation as Upilex ® and from Hitachi Chemical Company as PIQ-L100 ®. Other tradename polyimides useful pursuant to the present invention include Durimid ® from Rogers Corporation and the DuPont Pyralin ® series, including PI-2525 and PI-2566. The Upilex polyimides, although possessing higher thermal and dimensional stability than the Kapton polyimides, have not been widely used in integrated circuit packaging because of the absence of efficient wet etching processes for such polyimides.

The electrons can be provided by means of a cathode in an electrochemical circuit, the potential applied to the cathode being equal to or negative of the reduction potential of the polymer or preferably by means of a reducing agent in solution. The oxidation potential of the reducing agent must be negative with respect to the reduction potential of the polymer.

With respect to the polyimides, the bis-imide functional groups of the polymer can be reduced (by one electron) to the radical anion, or reduced (by two electrons) to the dianion or diradical dianion or reduced (by three electrons) to the radical trianion. The following reaction illustrates the reduction scheme for 3,3',4,4'-benzophenone tetracarboxylic (BTDA) diimide functional group where $e^-$ is an electron and $C^+$ is a counter cation.

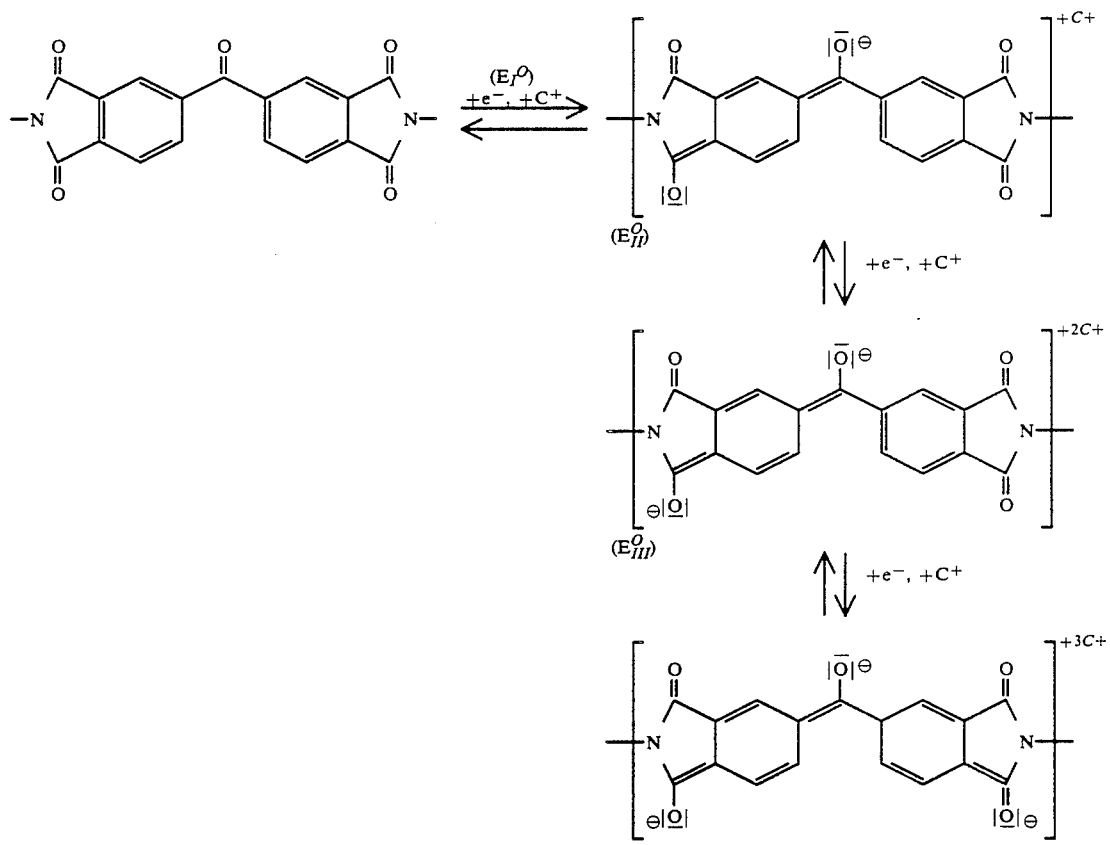

The following reaction illustrates the reduction of PMDA-ODA diimide functional group where $e^-$ is an electron and $C^+$ is a counter cation to the radical anion and dianion form.

Neutral PMDA—ODA

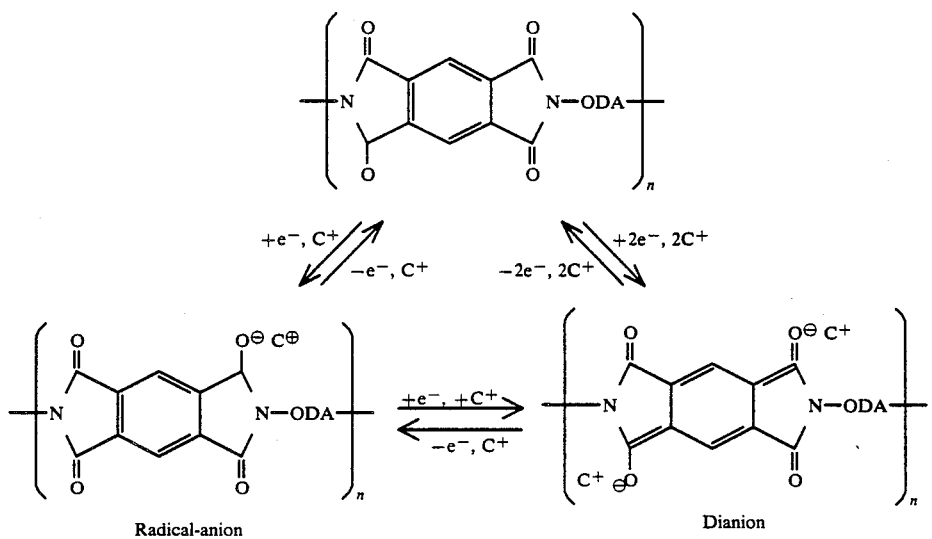

According to preferred aspects of the present invention, the reduction is achieved by means of a reducing agent that has an oxidation potential negative with respect to the reduction potential of the polymer. With respect to polyimides, compounds such as benzil anion, anthraquinone anion, benzophenone anion, benzoin dianion, sodium naphthalenide, anion of N,N'-di-n-butylpyromellitimide and even solvated electrons generated, for example, in liquid ammonia can be used as the reducing agent.

The reducing agents can be reducing agents, per se, or produced such as in situ by electrochemical means. The reducing agents can be generated by chemical reaction such as by reacting benzoin and potassium tert-butoxide or be a compound having a strong electron donating power such as tetrakis(dimethylamino)ethylene (TKDE).

Examples of suitable organic compounds that can be electrochemically reduced to provide the chemical reducing agent include, but are not limited to, the following groups of compounds: unsaturated aromatic hydrocarbons (e.g., anthracene), aldehydes and ketones (e.g., benzaldehyde, dibenzoylmethane) imides (e.g., N-n-butylphthalimide, N,N'-di-n-butyl-3-3',4,4'-biphenyl tetracarboxylic diimide), carbodiimides (e.g., bis(chlorophenyl) carbodiimide), aromatic heterocyclic nitrogen compounds (e.g., 9,10-diazaphenathrene), anhydrides (e.g., 1,8-naphthalic anhydride, 3,3',4,4'benzophenone tetracarboxylic dianhydride), quinone (e.g., 9,10-anthraquinone), quaternary aromatic nitrogen compounds (e.g., 1-ethylpyridinium bromide), azomethines (e.g., N-p-biphenylbenzalimine), immonium salts (e.g., N-ethyl-N-methyl benzophenone immonium salt), azo compounds (e.g., 4,4'-azobiphenyl), amine oxides (e.g., acridine N-oxide), nitro and nitroso compounds (e.g., 2-t-butylnitrobenzene), and organometallic compounds (e.g., diphenylchromium (I) iodide).

Benzil, 9-fluorenone, benzophenone and anthracene are examples of specific compounds that can be reduced to provide the chemical reducing agents suitable for carrying out the present invention. The compounds can be reduced by applying such to an electrochemical cell containing an anode and a cathode and then applying a voltage.

The compounds can be reduced electrochemically or by bulk electrolysis. Typically, this is done using a two-compartment cell whereby the compartments are separated by a sintered glass disk or frit having a porosity of less than 8 $\mu$m. A salt bridge or semi-permeable membrane also could be used to separate the compartments. The working compartment is housed with a cathode electrode which is comprised of a metal such as platinum, mercury, or stainless steel. The anode electrode is comprised of a conductor such as platinum, carbon, or stainless steel. For potentiostatic operation, an appropriate reference electrode is positioned in the working compartment (e.g., Ag/0.1M AgNO$_3$). The cell can be purged with an inert gas such as N$_2$ or argon using an inlet tube and one-way valve or operation can be done in a glove box under inert atmosphere.

Electrochemical generation of the reducing agent is accomplished by either galvanostatic, potentiostatic, or voltage-controlled electrolysis. Typically, the current density range for galvanostatic reduction is 0.1 to 2 mA/cm$^2$. In potentiostatic mode, reduction is mA/cm typically done by applying a potential to the cathode which is more negative (e.g.—50 mV or more) than the reduction potential for the organic compounds as measured against the same reference electrode.

Compounds such as potassium tert-butoxide can react with aromatic ketones and alcohols to form anionic species. For instance, potassium tert-butoxide reacts with benzoin to form the benzoin dianion.

In addition, the composition used to reduce the polymer will include in the solution a supporting electrolyte and preferably a supporting electrolyte salt that contains as cation a member from one of the following groups: tetraalkylammonium, tetraalkylphosphonium, alkali metal, aryl-alkylammonium, aryl-alkylphosphonium, or chelated metal. The preferred tetraalkylammonium group is tetrabutylammonium, but other tetraalkyls with alkyl group being methyl, ethyl, propyl, isopropyl, pentyl, hexyl, or mixed alkyl thereof can be employed if desired. An example of a typical aryl group is phenyl and an aryl-alkylammonium is benzyltributylammonium. An example of a chelated metal cation is potassium 18-crown-6. The supporting electrolyte salt preferably contains as anion one of the following: tetrafluoroborate, hexafluorophosphate, aryl sulfonate, perchlorate, or halide such as bromide or iodide.

The electrolyte solution is preferably comprised of an aprotic solvent. The aprotic solvents suitable for use in this invention include, but are not limited to, the following: nitrile and nitro compounds (e.g., acetonitrile, benzonitrile, nitromethane), amide and cyclic amide compounds (e.g., N,N-diemthylformamide, N-methylformamide, N,N-diethylformamide, N-ethylformamide, N,N-dimethylacetamide, N-methyl-2-pyrrolidinone, hexamethylphosphoramide, ester, cyclic ester, and ether compounds (e.g., propylene carbonate, ethylene carbonate, γ-butyrolactone, ethyl acetate, tetrahydrofuran, dioxane, dimethylether), oxide and sulfo compounds (e.g., dimethylsulfoxide, acetone, liquid sulfer dioxide, sulfolane, dimethylsulfone).

The reducing agents generated electrochemically, according to the present invention, are typically neutral organic molecules which are electrochemically charged, thereby transferring electrons to the polymer, thereby reducing it. The electron transfer returns the reducing agent back to its neutral state. This is in sharp contrast to those reducing agents such as Zintl complexes that result in anions remaining with the polymer or are intercalated.

It has also been found, pursuant to the present invention, that the electrons can be supplied by contacting the polymeric material with tetrakis(dimethylamino)ethylene (TKDE). Tetrakis(dimethylamino)ethylene is represented by the formula:

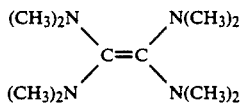

The TKDE can be used as such or employed in solution with an organic solvent including the aprotic solvents discussed above. Also, protic solvents such as water and alcohols including methanol, ethanol, and ethylene glycol can be used provided such are made alkaline (e.g.—adding a base). The TKDE reduces sites of the polymeric material to, for example, the radical anion form while it is concurrently oxidized to a cation form. The TKDE cations function as counter-ions to balance the charge imparted to the polymer in order to maintain electroneutrality throughout the polymer. The oxidized TKDE (cation) can subsequently be regenerated to neutral TKDE, for example, by reductive electrolysis. This material can function as the solvent and counter-ions in addition to its reducing agent function.

The polyimide, which, after being reduced by the reducing agent contains a region of reduced polyimide near the exposed surface, can then be exposed to a solution of the nucleophile in order to open at least one of the imide rings in the polyimide repeat unit.

The electrons can be supplied to the redox sites of polymeric material also by employing electrochemical means. In particular, the process involved requires providing the polymer onto a metal electrode which, when negatively biased, acts as a cathode in the circuit.

A typical arrangement to carry out this particular procedure pursuant to the present invention is illustrated in U.S. Pat. No. 4,512,855.

The combination of the electrode and polymeric film is then immersed into an electrolyte solution in an aprotic solvent.

In addition, the composition used to reduce the polymer will include in the solution a supporting electrolyte and preferably a supporting electrolyte salt that contains as cation a member from one of the following groups: tetraalkylammonium, tetraalkylphosphonium, alkali metal, aryl-alkylammonium, aryl-alkylphosphonium, or chelated metal. The preferred tetraalkylammonium group is tetrabutylammonium, but other tetraalkyls with alkyl group being methyl, ethyl, propyl, isopropyl, pentyl, hexyl, or mixed alkyl thereof can be employed if desired. An example of a typical aryl group is phenyl and an aryl-alkylammonium is benzyltributylammonium. An example of a chelated metal cation is potassium 18-crown-6. The supporting electrolyte salt preferably contains as anion one of the following tetrafluoroborate, hexafluorophosphate, arylsulfonate, perchlorate, or halide such as bromide or iodide.

The electrolyte solution is preferably an aprotic solvent. The aprotic solvents suitable for use in this invention include, but are not limited to the following: nitrile and nitro compounds (e.g., acetonitrile, benzonitrile, nitromethane), amide and cyclic amide compounds (e.g., N,N-dimethylformamide, N-methylformamide, N,N-diethylformamide, N-ethylformamide, N,N-dimethylacetamide, N-methyl-2-pyrrolidone, hexamethylphosphoramide), ester, cyclic ester, and ether compounds (e.g., propylene carbonate, ethylene carbonate, γ-butyrolactone, ethyl acetate, tetrahydrofuran, dimethylether), oxide and sulfo compounds (e.g., dimethylsulfoxide, acetone, liquid sulfur dioxide, sulfolane, dimethylsulfone).

In the event that the electrons are supplied to the polymeric film by a cathode in an electrochemical circuit, the potential applied to the cathode must be equal to or negative of the reduction potential of the polymer for which typically values are given below.

The first electron reduction potential $E_1^0$ for various polyimides are given:

|  |  | $E_1^*$ |
| --- | --- | --- |
| PMDA-ODA[4] | (Kapton ®) | −0.78 |
| BPDA-PDA[5] | (Upilex ®) | −1.34 |
| BTDA-DAPI[1] | (XU-218 ®) | −1.04 |
| BTDA-APB[3] | (Thermid ®) | −0.96 |
| NTDA-ODA[2] |  | −0.64 |

$E_1^*$ is referenced versus the saturated calomel electrode and determined by cyclic voltammetry in 0.1M tetrabutylammonium tetrafluoroborate in acetonitrile.
[1]BTDA-DAPI is 3,3',4,4'-benzophenone tetracarboxylic dianhydride-diamino-1,3,3-trimethyl-1-phenylindan which is commercially available from Ciba Geigy under the tradename XU-218.
[2]NTDA-ODA is 1,4,5,8-naphthalene tetracarboxylic dianhydride-4,4'-oxydianiline.
[3]BTDA-APB is 3,3',4,4'-benzophenone tetracarboxylic dianhydride-1,3-bis-(2-aminophenoxy)benzene is commercially available from National Starch and Chemical Company under tradename Thermid.
[4]Trademark of DuPont.
[5]Trademark of Ube.

If the polyimide material is in a liquid form, it can be added to a solution with the solvents above and reduced by the chemical or electrochemical methods described herein above. If the polyimide material is not soluble in the solvent, the insoluble polyimide can be placed into an aprotic solvent as described above. Reduced polyimide will then become soluble in the aprotic solvent. Examples of polyimides which are not directly soluble in commonly available solvents are polyimide materials based on PMDA-ODA (pyromellitic dianhydride-oxydianiline) and BPDA-PDA (biphenyltetracarboxylic dianhydride-phenylenediamine). Examples of polyimides which are soluble in the commonly available solvents are Thermid ® and XU-218 ®.

The present invention is not limited to chemical and electrochemical methods for reducing the polyimide described herein above. Any method of providing electrons to the imide functional groups of the polyimide can be used to practice the present invention.

Although applicants do not want to be limited to a specific mechanism, applicants believe that the process of the invention can be summarized by the following two sequences of equations. The first sequence, in equation 1 shows a polyimide material reduced to the dianion form and treated in equation 2 with a nucleophilic reagent. The second sequence, in equation 5 shows the polyimide material reduced to the radical anion form and treated with an nucleophilic reagent in equation 6. It will be readily recognized by an artisan that a polyimide material reduced to a tranion form will proceed by a combination of the first and second sequence. For simplicity a simple bidentate nucleophile XYRYX is shown in the first and second reaction sequence: the two X's can be the same or different leaving groups; the two Y's can be the same or different Y atoms. R is defined above. The X's and Y's are assumed for simplicity to have a valence having magnitude 1. It will be apparent to those of skill in the art how sequence 1 and 2 is to be modified for a nucleoplite having general formula given below.

SEQUENCE 1

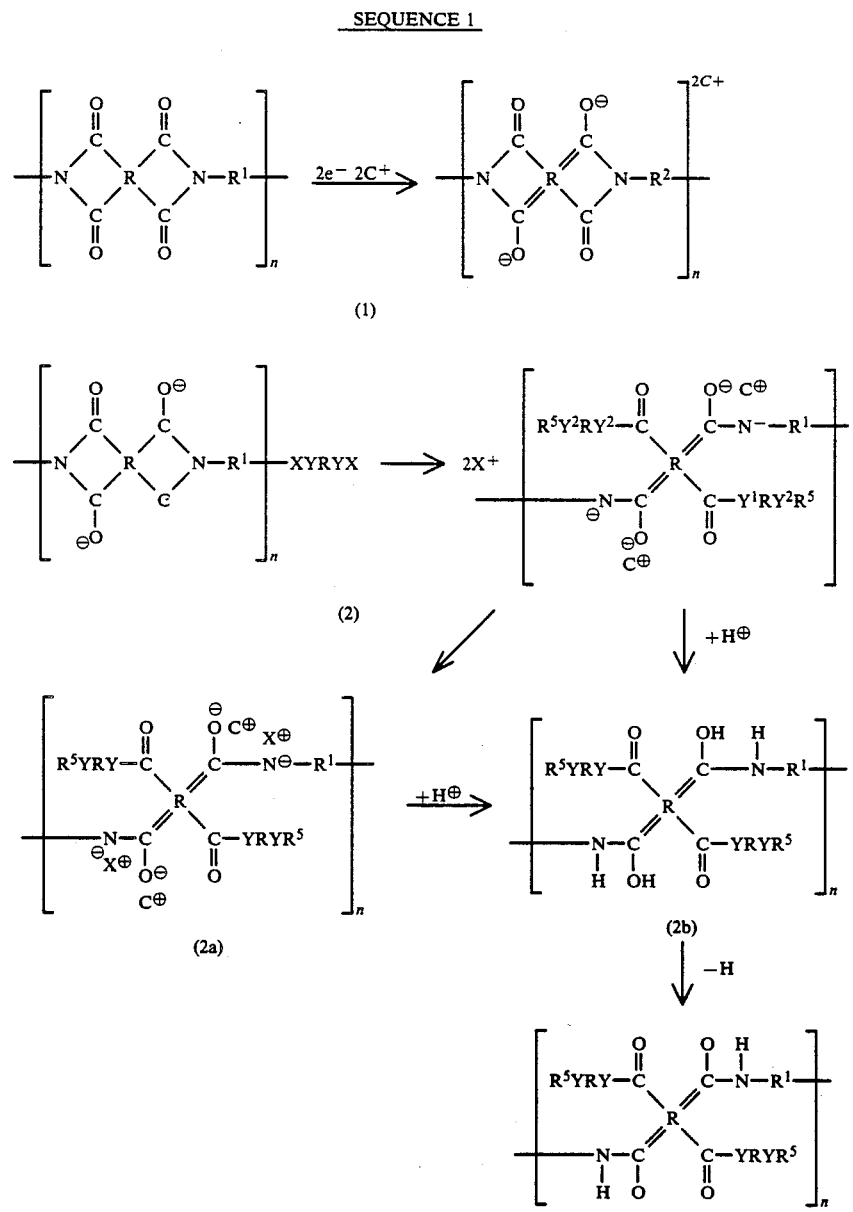

SEQUENCE 2

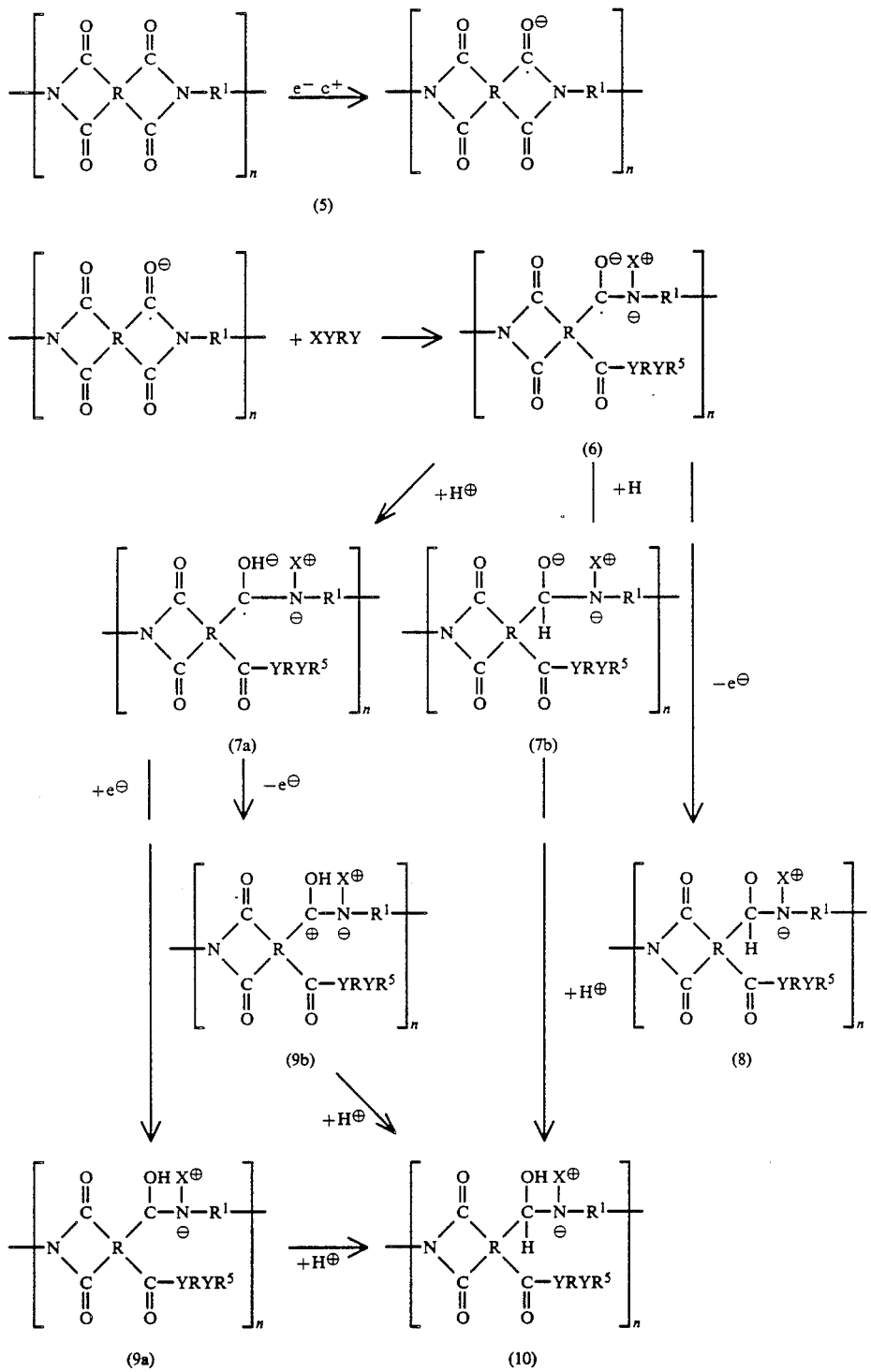

The second step of the process of the invention (equation 2 of sequence 1 and equation 6 of sequence 2) is directed to exposing the reduced polyimide material to a nucleophilic reagent to form a precursor or intermediate derivative to the derivatives of the present invention. It is believed that the nucleophilic reagent attacks the bond between the nitrogen atom and the carbonyl carbon of the imide groups of the reduced polyimide.

Nucleophiles useful to practice this invention preferably have the following structural formula:

$R(R_s'Y_tX_m)_n$

R is an organic or an inorganic radical; R is selected from at least one of the group of an aliphatic radical, a substituted aliphatic radical, an aromatic radical, a substituted aromatic radical, a heterocyclic radical, a substituted heterocyclic radical and combinations thereof. Y is selected from one or more of the group of O, S, N, C, and Si. X is a monovalent or poly valent cationic leaving group, preferably selected from one or more of the group of $H^+$, $Na^+$, $Li^+$, $K^+$, $Cs^+$. Examples of polyvalent leaving groups are $Mg^{+2}$, $Ca^{+2}$, $V^{+3}$. These lists are examples only and not limiting. Each member of the group of R, R', Y and X forms at least one $s \geq 0$, $t \geq 0$, $m \geq 1$ and $n \geq 1$, where m is the number of leaving groups and n is the number of reactive sites, wherein preferably n, s, t, $m \leq 10$, wherein most preferably n, m, $t \leq 4$ and $s \leq 6$. The magnitude of the valences of R, R', Y and X can be greater than or equal to 1.

When n=1, the nucleophile is monodentate, when n=2 the nucleophile is bidentate and when n>1, the nucleophile is polydentate. A polydentate nucleophile can have more then one type of Y atom. One of the Y atoms can chemically bond with the reduced carbonyl group of the molecule to be derivatized.

The substituted R radicals can contain functional groups containing O, S, N, C, P and Si. The derivative formed by the process of the present invention can then undergo further chemistry using these functional groups, e.g. such as for epoxification or chelation reactions.

Where the nucleophile is monodentate and the cation leaving group, $X^{+r}$, has a value of r greater than 1 or where there is more than one leaving group, the RY-anion forms a chemical bond with the carbon atom of the nonreduced carbonyl group. This leaves at least unpaired electrons on the RY-anion which can chemically combine with other molecules or carbon atoms of nonreduced carbonyl groups of different repeat units on the same or another reduced polyimide molecule which are represented by $R^5$.

Where the nucleophile is polydentate one of the Y sites can nucleophilically attack a nonreduced carbonyl groups of the imide group and the other Y sites can be free for further chemical reactions.

In solution the cationic leaving group leaves the nucleophile. As shown in equation 2, it is believed that the RY-anion chemically attacks the chemical bond between the nitrogen atom and the carbon atom of the nonreduced carbonyl group to open the imide ring and to chemically combine with the carbon atom of the nonreduced carbonyl group. Free protons or cations supplied by the electrolyte in solution combine with the oxygen atom of the reduced carbonyl group and with nitrogen atom.

If the nucleophile is in liquid form it can be added to the solution containing the reduced polyimide in drop form. Excess nucleophile can be added to solution or an artisan, knowing data about efficiency of the nucleophilic reaction with various imide moieties can calculate the modification of the solution. If the nucleophile is in solid form, it is preferably solubilized in a solvent compatible with the solvent used for the reduced polyimide. Preferably, the solvent used to solubilize a solid nucleophile will be the same solvent used for the reduced polyimide. Suitable solvents are listed herein above.

Examples of the aliphatic radical R', of the nucleophile are: methyl, ethyl, propyl and t-butyl. This list is exemplary only and not limiting.

Examples of the aromatic radical R', of the nucleophile are: benzene, naphthalene and anthracene. This list is exemplary only and not limiting.

Examples of the heterocyclic radial R', of the nucleophile are: pyridine, thiophene, furan, imidazole and triazole. This list is exemplary only and not limiting.

Examples of nucleophiles having oxygen as the Y constituent are: alcohols and salts of alcohols. This list is exemplary only and not limiting.

Examples of nucleophiles containing sulfur as the Y constituent are: aliphatic and aromatic thiols and substituted aliphatic and aromatic thiols and the corresponding anions. This list is exemplary only and not limiting.

Examples of nucleophiles containing carbon as the Y constituents are: anionic carbon containing compound, e.g., aryl salts, alkyl salts and Grignard's of all types, e.g., n-butyl lithium, methyl lithium and benzyl lithium. This list is exemplary only and not limiting.

Examples of nucleophiles containing silicon as the Y constituent are $L^+Si^-R'$ wherein R' is aliphatic, the most preferred being methyl or ethyl. The list is exemplary only and not limiting.

Examples of nucleophiles containing nitrogen as the Y constituent are primary and secondary amines. This list is exemplary only and not limiting.

Where the nucleophile is polydentate one of the reactive sites can chemically react with the compound having the imide group conjugated to the aromatic moiety. The other reactive sites are free for further chemical reactions.

The X constituent of the nucleophile is a cationic leaving group. The X constituent readily dissociates from the R-Y moiety of the nucleophile at some point along the reaction pathway.

The artisan will recognize that the degree of derivatization desired depends on the concentration of the nucleophile in the solution. The reduced polyimide material species can withstand elevated temperatures. At elevated temperatures the reaction rate of the nucleophile increases.

The preferred nucleophiles are alkyl alcohols. The most preferred nucleophile is ethyl alcohol. The most preferred derivative is a polyamic ethyl ester.

If the reduced polyimide is treated with water as the nucleophile the polyamic acid precursor of the polyimide is generated.

In the third step of the process of the invention, (going from equation 2a or 2b to equation 3 in sequence I) hydrogen atoms are extracted from product of the second step of the invention to reform a carbonyl group at the oxygen atoms which had been reduced in the first step of the process of the invention. This is achieved by exposing the product of the second step of the invention to an oxidizing agent.

The oxidizing agent needs a reduction potential more positive than the oxidizing potential of the intermediate reaction product.

The preferred oxidizing agents are dry atmospheric oxygen and tetrachlorobenzoquinone. The most preferred oxidizing agent is dry atmospheric oxygen which can be bubbled through the solution containing the product of the second step of the invention.

The final product of the process of the current invention is represented by the structural formula which is the product of the third step of the invention. In the preferred embodiment $R_2$ is an alkyl radical and Y is an oxygen atom. In the most preferred embodiment of the present invention $R_2$ is ethyl radical and y is an oxygen atom, the product of the third step of the invention being a polyamic ethylester. When R is a benzene radical the ester product of the third step of the invention is the most preferred embodiment of the polyimide material derivative synthesized by the process of the present invention.

The second and third steps of the process of the present invention do not have to be separate and distinct steps. To the solution containing the reduced polyimide which is the product of the first step of the present invention, both the nucleophile and the reducing agent can be added. The nucleophilic attack of the nucleophile and the oxidation are competing reactions. If the rate of nucleophilic attack is greater than the rate of oxidation in solution the product of the second step will be formed and thereafter in the same solution oxidized as shown in the third step of the present invention. If the rate of oxidation exceeds rate of nucleophilic attack then the reduced polyimide which is the product of the first equation, will be oxidized back to the polyimide form. When the rate of oxidation exceeds the rate of nucleophile attack, the nucleophilic attack and oxidation are done in two steps. The most preferred sequence is the two step process. As will be recognized by those of skill in the art, the strength of the nucleophilic attack relative to the oxidation depends upon the nucleophile, the oxidizing reagent chosen and the particular polyimide chosen.

The product of the method of the present invention is the product of equations 3, 8 or 10 above.

When the Y constituent in a product of equation 3,8 or 10 is a sulfur atom, a nitrogen atom, a carbon atom, or a silicon atom, it can be used as an intermediate product for further chemical reactions. For example when y is a silicon atom, the modified polyimide surface can be exposed to $O_2$ or $CF_4$ reactive ion etch process to oxidize the surface creating etch stop layer for a substant polyimide etch step. When Y is an oxygen atom a polyamic ester can be formed without the use of chlorine containing compounds. The ester can be imidized to a polyimide. When Y is a nitrogen atom an amide derivative is formed. The amide constituent increases the temperature required to cure to a polyimide. When Y is a sulfur atom, the sulfur moiety enhances the adhesure of the polymer to a metal, such as copper. When Y is carbon, the carbon moiety enhances adhesion of the polymers to another polymer and also can be used to cross-link the polymer. When Y is C, S or N, the nucleophile can be used to modify an imide compound to attach pendant chelating groups such as EDTA at Y sites of the nucleophile.

If the derivative is in solution it can be separated by commonly known precipitation methods.

If the derivative is solid, such as a film, it is cleaned in a solvent.

The reduced polyimide material according to equation 1 of the present invention can have the added electrons in either the 1,3 or 1,4 configuration. This is determined by the structure of the R constituent of the polyimide material. If the R constituent of the polyimide material is a benzene radical, the electrons are added in a 1,4 configuration. This results in a polyimide derivative according to equation 3 of the present invention having the added groups in the 1,4 configuration. When the nucleophile is an organic alcohol, the polyimide derivative according to the present invention is a 1,4 polyamic ethylester shown if the following equation:

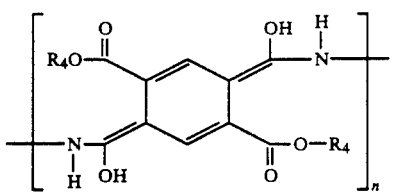

When this is heated to cure to a polyimide the resulting polyimide derivative can be densely packed since the added organic constituents occupy the 1,4 configuration. As will be recognized by those of skill in the art the trans configuration will have a substantially higher packing density then will polyimides of the 1,3 configuration.

For a polyimide material having naphthelene as the R constituent and the imide groups in a six element ring, the reduced form can have the 1,3 or 1,4 configuration as shown in the following equation:

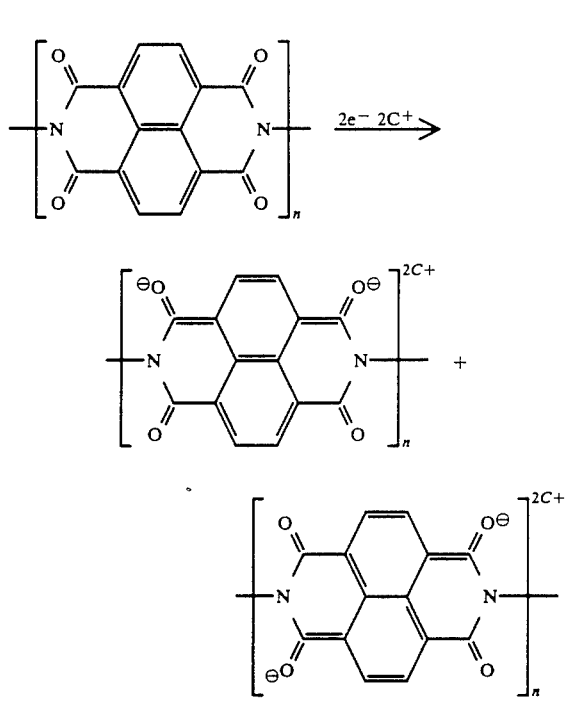

For a polyimide material having naphthelene or other polyaromatic hydrocarbon as the R constituent and the imide groups as part of the five member ring, the reduced form of the polyimide material has the 1,4 configuration has shown in the following equation:

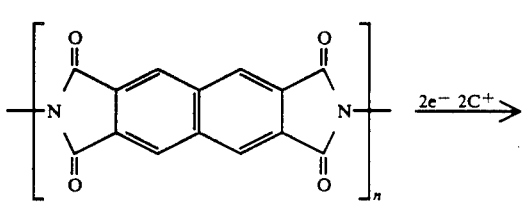

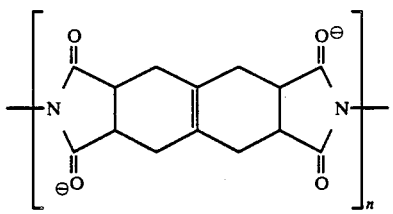

These equations are exemplary only and not limiting.

Also, if desired, the polyimide material can be selectively treated according to the method of the present invention. For example, prior to exposing the polyimide material to the reducing agent, the polyimide material can be coated with a resist like material which cannot be activated by the process described above. Examples of a resist which are not reduced in the manner that the polyimide material is reduced are Waycoat SC (sold by Hunt Chemical Company) and KTFR (sold by Kodak Inc.) The resist is selectively patterned and developed. Only where the resist is removed will the polyimide material be reduced upon exposure to the reducing agent. Silicon nitride can be used as a mask for the selective reduction of the polyimide material surface. It has also been observed that polyimide material exposed to reactive ion etching (RIE) does not undergo effective reduction when exposed to the reducing agent according to the present invention, probably due to oxidation of the polyimide surface. Furthermore, the polyimide material exposed to RIE can again be rendered susceptible to reduction according to the present invention by, for example, treatment in a gas environment of about 3 to 10% hydrogen in nitrogen for about 15 to 30 minutes. Therefore, the polyimide exposed to RIE can be used as a mask for selective modification of the polyimide surface which has subsequently been treated in a gas environment described above, or by polyimide material not previously exposed to RIE.

EXAMPLE 1

PMDA-ODA polyimide films are prepared by spin coating polyamic acid, 10.7% in N,N-dimethylacetamide, at 1200 rpm or 2000 rpm onto stainless steel foil.

The polyimide is imidized by exposing the coated substrate to an atmosphere saturated with NMP at about 51° C. for 1.5 hours, followed by immersion in an equal volume mixture of anhydrous pyridine and acetic anhydride at 25° C. for 2 hours. The films are then rinsed with methanol and dried at 90° C. under vacuum, for 1 hour. The final thickness of the polyimide films are 8.6 μm and 13.5 μm, for films spun at 2000 and 1200 rpm, respectively. These coated structures are made into polyimide-modified electrodes by making electrical contact to the stainless steel substrate.

The polyimide-modified electrode is used as the cathode in an electrochemical cell containing 0.1M tetrabutylammonium tetrafluoroborate in N,N-dimethylformamide solution. The cathode is held at a constant potential of $-1.8$ V versus saturated calomel electrode (SCE). The polyimide film initially turns green then becomes purple in color. After 10 minutes in this potentiostatic mode, a soluble purple colored product streams from the electrode surface and after 30 minutes, the film is entirely dissolved, resulting in a purple solution. Cyclic voltammetry and UV-Vis spectroscopy of the dissolved polyimide solution showed two reversible redox reactions corresponding to reduction of the pyromellitic dianhydride (PMDA) moiety to the radical anion and dianion states.

To a 30 mL solution of dissolved film (approximate concentration of 1-10 nM) was added 10 mL of neat, degassed, absolute ethanol. There was no discernible color change upon addition under $N_2$. Upon oxidation by $O_2$ a color change to yellow was observed. After standing for 15 minutes, a yellow precipitate settled out and was collected, filtered and washed with ethanol and acetone. This solid was redissolved in N-methyl-2-pyrrolidone and spun onto a KBr disc for subsequent IR analysis. After baking at 90° C. for 2 minutes to remove solvent, an IR was taken which matches that observed for polyamic ethylester, made by the conventional route.

EXAMPLE 2

Example 1 is repeated using acentonitrile instead of N,N-dimethylformamide as the solvent for reduction of the polyimide to the dianion, followed by dissolution.

EXAMPLE 3

A solution of approximately 0.05M benzil and 0.1M tetrabutylammonium tetrafluoroborate (TBAFB) in acetonitrile is reduced at a constant current of 15 mA at a platinum mesh electrode. The measured potential is $-1.45$ V vs. Ag/0.1M $AgNO_3$ reference electrode. Benzil reduction is halted after about 14% conversion to the benzil radical anion form. The characteristic blue color of the radical anion of benzil is observed during reduction.

2 mil thick Kapton (PMDA-ODA) polyimide films measuring 2 inches×4 inches are exposed to the benzil reducing agent solution for 30 seconds and 4 minutes to reduce the Kapton surface to the green-colored radical anion form. The films are rinsed with acetonitrile to remove any residual material from the surface. Next, the films are immersed in a neat solution of allylamine for 45 minutes at 23° C. After rinsing in acetonitrile and drying under vacuum, the film was oxidized back to the neutral form upon exposure to dry air. This is followed by rinsing with methanol and drying with nitrogen. Subsequent IR analysis showed almost complete attenuation of the imide carbonyl stretching frequencies at 1720 and 1372 $cm^{-1}$. Concomitant with this was the production of new peaks at 1642 and 1540 $cm^{-1}$, corresponding to the diamide species formed upon imide ring opening.

EXAMPLE 4

Example 3 is repeated for reduction of a Kapton film. After rinsing with acetonitrile, the film is immersed in neat allylamine for 60 minutes at 23° C. The modified film is then rinsed with acetonitrile and oxidized using a saturated acetonitrile solution of tetrachloro-1,4-benzoquinone (TCBQ). Oxidation was monitored by a color change of the film from green to the yellow color of the neutral film and continued for an additional 15 minutes after this color change. Again, the film is rinsed with either acetonitrile or methanol and dried under vacuum. Infrared analysis gave results virtually identical to those described in Example 3.

It is to be understood that the above described embodiments are simply illustrative of the principles of the invention. Various other modifications add changes may be devised by those skilled in the art which will embody the principles of the invention and fall within the spirit and scope thereof.

Having thus described the invention, we claim as new and desire to secure by Letters Patent is:

1. A method for forming a derivative of an imide material containing an imide group conjugated to an aromatic moiety to form a material selected from the group consisting of an ester, a thioester, an amide, a ketone, and a silylester comprising:

supply at least one electron to said imide group conjugated to an aromatic moiety of said imide material to form an anionic form of said imide group conjugated to said aromatic moiety;

contacting said imide material with said at least one electron thereon with a nucleophile containing at least one atom selected from the group consisting from the group of O, S, N, C and Si;

there being at least one cationic leaving group bonded to said at least one atom.

2. The method of claim 1, wherein said nucleophile has structural formula:

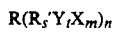

wherein each R' is selected from the group consisting of hydrogen, an aliphatic radical, a substituted aliphatic radical, an aromatic radical a substituted aromatic radical, a heterocyclic radical, a substituted heterocyclic radical and combinations thereof;

wherein R is selected from the group consisting of organic and inorganic radicals;

wherein Y is selected from the group consisting of O, S, N, C, and Si;

wherein X is a cationic leaving group;

wherein $s \geq 0$, $t \geq 0$, $m \geq 1$ and $n \geq 1$;

wherein each member of the group of R, R', Y and X forms at least one chemical bond with at least one other member of the group R, R', Y and X; and wherein there is at least one X bonded to one Y.

3. The method of claim 1, further including treating said imide material to an oxidizing agent.

4. The method of claim 1, wherein said imide material is a polyimide material.

5. The method of claim 1, wherein said at least one electron are supplied to one of the carbonyl groups of said imide group conjugated to an aromatic moiety to form a reduced imide group having a reduced carbonyl group, said nucleophile opens the ring of said reduced imide group and chemically combines with the nonreduced carbonyl group of said reduced imide group.

6. The method of claim 1, wherein said cationic leaving group is selected from the group consisting of $H^+$, $Na^+$, $Li^+$, $K^+$, $Cs^+$, $Ca^{+2}$ and $V^{+3}$.

7. The method of claim 3, wherein said oxidizing agent has a reduction potential more positive than the oxidation potential of said polyimide material treated with said nucleophile.

8. The method of claim 7 wherein said oxidizing agent is oxygen.

9. The method of claim 1, wherein said at least one electron are supplied to said imide material by contacting said material with a solution containing a chemical reducing agent that is energetically disposed to transferring electron(s) to said redox sites in said material without causing chemical reducing agent to remain with said material.

10. The method of claim 4 wherein said polyimide material is cured by any method by which imide ring cyclization can be obtained, 11. The method of claim 10 wherein said polyimide material is a free-standing or supported film derived from a dianhydride selected from the group consisting of pyromellitic dianhydride, 3,3',4,4'-benzophenonetetracarboxylic dianhydride, 3,3',4,4'-biphenyltetracarboxylic dianhydride, naphthalenetetracarboxylic dianhydride, perylenetetracarboxylic dianhydride, 4,4'-(hexafluoroisopropylidene)-bis-phthalic anhydride, and bis(3,4-dicarboxy-phenyl) sulfide dianhydride.

12. The method of claim 9 wherein said chemical reducing agent is neutral organic compound whereby all or a portion of the said neutral organic compound has been electrochemically reduced in an aprotic solvent containing a supporting electrolyte salt.

13. The method of claim 12 wherein said neutral organic compound is at least one species selected from the group consisting of unsaturated aromatic hydrocarbons, aromatic carbonyl compounds, imides, diimides, carbodiimides, anhydrides, quinones, quaternary aromatic nitrogen compounds, aromatic heterocyclic nitrogen compounds, azomethanes, immonium salts, azo compounds, amine oxides, nitro and nitroso compounds and organometallic compounds.

14. The method of claim 9 wherein said reducing agent is selected from the group consisting of benzoin dianion, benzil anion, anthracene anion, dibenzoylmethane anion, benzophenone anion, anthraquinone anion, 9-fluorenone, N-n-butylphthalimide anion, N,N'-di-n-butyl-3,3',4,4'-biphenylteteracarboxylic diimide anion, N,N'-di-n-butylpyromellitic diimide anion, acridine anion, and 1-azafluoranthracne anion.

15. The method of claim 12 wherein said supporting electrolyte salt contains a cation which is at least one member of the group consisting of tetraalkylammonium, tetraalkylphosphonium, alkali metal, mixed alkyl-aryl ammonium, mixed alkyl-aryl phosphonium, or chelated metal and said supporting electrolyte salt anion is at least one member selected from the group consisting of tetrafluoroborate, hexafluorophosphate, perchlorate, halide, and aromatic organic compounds.

16. The method of claim 12 wherein said supporting electrolyte salt contains at least one member selected from the group consisting of tetrabutylammonium tetrafluoroborate, tetraethylammonium tetrafluoroborate, tetrabutylammonium hexafluorophosphate, tetraethylammonium bromide, lithium tetrafluoroborate, lithium perchlorate, benzyltributylammonium tetrafluoroborate, and sodium naphthalenide.

17. The method of claim 12 wherein said aprotic solvent is at least one member selected from the group consisting of nitriles, nitro compounds, amides, cyclic amides, amines, esters, cyclic esters, ethers, carbonates, oxides, and sulfo compounds.

18. The method of claim 12 wherein the said aprotic solvent is selected from at least one member of the group consisting of acetonitrile, N,N-dimethylformamide, N-methylformamide, N,N-diethylformamide, N-ethylformamide, N,N-dimethylacetamide, N-methyl-2-pyrrolidinone, hexamethylphosphoramide, propylene carbonate, ethylene carbonate, $\tau$-butyrolactone, dimethylsulfoxide, acetone, and sulfolane.

19. The method of claim 1 wherein said at least one electron are supplied electrochemically.

20. The method of claim 1 wherein said at least one electron are supplied electrochemically by a cathode in contact with said imide compound in an electrochemical circuit using an aprotic solvent containing a supporting electrolyte salt.

21. The method of claim 20 wherein said imide material is a material which is derived from a dianhydride selected from the group consisting of pyromellitic dianhydride, 3,3',4,4'-benzophenonetetracarboxylic dianhydride, 3,3'4,4'-biphenyltetracarboxylic dianhydride, naphthalenetetracarboxylic dianhydride, perylenetetracarboxylic dianhydride, 4,4'-(hexafluoroisopropylidene)bis-phthalic anhydride, and bis(3,4-dicarboxyphenyl) sulfide dianhydride.

22. The method of claim 20 wherein said supporting electrolyte salt contains a cation of at least one member selected from the group consisting of tetraalkylammonium, tetraalkylphosphonium, alkali metal, mixed alkyl-aryl ammonium, mixed alkyl-aryl phosphonium, or chelated metal, and said supporting electrolyte salt anion is selected from at least one member of the group tetrafluoroborate, hexafluorophosphate, percholorate, halide, aryl sulfonate, or aromatic organic compounds.

23. The method of claim 20 wherein said supporting electrolyte salt is at least one member selected from the group consisting of tetrabutylammonium tetrafluoroborate, tetraethylammonium tetrafluoroborate, tetrabutylammonium hexafluorophosphate, tetraethylammonium bromide, lithium tetrafluoroborate, lithium perchlorate, benzyltributylammonium tetrafluoroborate.

24. The method of claim 1 wherein said imide material is a bulk material and wherein a surface of said imide material is patterned with a resist like material or metal to act as a mask prior to supplying electrons to said redox sites thereby selectively exposing said surface to said electrons.

25. The method of claim 1, wherein said nucleophile having O as said Y constituent is selected from the group consisting of water organic alcohols and organic alkoxides.

26. The method of claim 1 wherein said nucleophile is ethyl alcohol, said imide material is a polyimide and said derivative is a polyamic ethylester.

27. The method of claim 1, wherein said nucleophile having S as said Y constituent is selected from the group consisting of thiolate anions and H—S—R thiols wherein R is an organic radical.

28. The method of claim 1, wherein said nucleophile having N as said Y constituent is selected from the group consisting of amines and amides.

29. The method of claim 1, wherein said nucleophile having C as the Y constituent is selected from the group consisting of anionic carbon containing compounds and Grignard reagents.

30. The method of claim 1 wherein the nucleophile having Si as the Y constituent is selected from the group consisting of silylanions.

31. The method of claim 1, wherein a support solvent for said nucleophile is an aprotic solvent.

32. The method of claim 31 wherein said aprotic solvent is at least one member selected from the group consisting of nitriles, nitro compounds, amides, cyclic amides, amines, esters, ethers, carbonates, oxides, and sulfo compounds.

33. The method of claim 31 wherein the said aprotic solvent is selected from at least one member of the group consisting of acetonitrile, N,N-dimethylformamide, N-methylformamide, N,N-diethylformamide, N-ethylformamide, N,N-dimethylacetamide, N-methyl-2-pyrrolidone, hexamethylphosphoramide propyllene carbonate, τ-butyrolactone, dimethylsulfoxide, acetone, and sulfolane.

34. The method of claim 1, wherein said at least one electron supplied to said imide material provide a reduced form of said imide material, wherein said nucleophile opens at least one imide ring of said reduced imide material, one of said electrons residing at the oxygen atom of one of the carbonyl groups to provide a reduced carbonyl group of said imide material, wherein said nucleophile chemically combines with the carbon atom of the non-reduced carbonyl group.

35. A method for forming a derivative of a material containing an imide group conjugated to an aromatic moiety comprising:
supplying electrons to said imide group conjugated to an aromatic moiety to form a reduced anionic form of said material;
contacting said reduced anionic form with a nucleophile selected from the group consisting of compounds having structural formula:

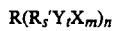

$$R(R_s'Y_tX_m)_n$$

wherein each R' is selected from the group consisting of hydrogen, aliphatic radical, a substituted aliphatic radical, an aromatic radical, a substituted aromatic radical, a heterocyclic radical, and a substituted heterocyclic radical;
wherein R is selected from the group of organic and inorganic radicals;
wherein Y is selected from the group consisting of O, S, N, C and Si;
wherein X is a cationic leaving group,
wherein $s \geq 0$, $t \geq 0$, $m \geq 1$ and $n \geq 1$;
wherein each group of R, R', Y and X form at least one chemical bond with at least one member of the group of R, R', Y and X; and
wherein at least one X is bonded to one Y,
said nucleophile opening the ring of said imide group with electrons thereon and chemically combining with the nonreduced carbonyl group of said imide group.

36. The method of claim 1, wherein said cationic leaving group is selected from the group consisting of monovalent, bivalent and polyvalent ions.

37. A method for forming a derivative of a material having an imide group conjugated to an aromatic moiety comprising:
supplying electrons to one carbonyl group of said imide group conjugated to an aromatic moiety to form a reduced anionic imide group having reduced carbonyl group;
contacting said reduced anionic imide group with a nucleophile;
said nucliophile opening the ring of said reduced anionic imide group and chemically combining with the nonreduced carbonyl group of said reduced anionic imide group.

38. The method of claim 10, wherein said polyimide is cured by a method selected from the group consisting of thermal and chemical dehydration.

39. The method of claim 15, wherein said aromatic organic compound is aryl sulfonate.

40. The method of claim 20, wherein said imide compound is electrochemically reduced by a method selected from the group consisting of control of a current supply and control of an applied potential

* * * * *